(12) United States Patent
Loughry et al.

(10) Patent No.: US 7,600,319 B2
(45) Date of Patent: Oct. 13, 2009

(54) METHOD OF MAKING AN ELECTROMAGNETIC INTERFERENCE SHIELDED PANEL

(75) Inventors: Gregory J. Loughry, Cadillac, MI (US);
Robert H. Spencer, Tustin, MI (US);
Tommy E. Dodd, Rocklin, CA (US)

(73) Assignee: AAR Corp., Wood Dale, IL (US)

( * ) Notice: Subject to any disclaimer, the term of this patent is extended or adjusted under 35 U.S.C. 154(b) by 153 days.

(21) Appl. No.: 11/770,287

(22) Filed: Jun. 28, 2007

(65) Prior Publication Data
US 2009/0000819 A1    Jan. 1, 2009

(51) Int. Cl.
B21D 47/00 (2006.01)
B21K 23/00 (2006.01)
B23P 17/00 (2006.01)

(52) U.S. Cl. .................. 29/897.32; 29/592.1; 29/602.1; 204/192.15; 174/384; 174/394

(58) Field of Classification Search ................ 29/592.1, 29/602.1, 897.32; 204/192.15; 174/384, 174/394
See application file for complete search history.

(56) References Cited

U.S. PATENT DOCUMENTS

| | | | |
|---|---|---|---|
| 2,831,912 A | 4/1958 | Williams | |
| 3,286,412 A * | 11/1966 | Greig et al. | 52/795.1 |
| 3,340,587 A | 9/1967 | Beyer | |
| 3,745,226 A | 7/1973 | Nichols et al. | |
| 4,143,501 A | 3/1979 | Tuttle | |
| 4,631,641 A | 12/1986 | Brombal et al. | |
| 4,691,483 A | 9/1987 | Anderson | |
| 4,748,789 A * | 6/1988 | Hedley | 52/789.1 |
| 4,787,181 A | 11/1988 | Witten et al. | |
| 5,239,125 A | 8/1993 | Savage et al. | |
| 5,713,178 A | 2/1998 | Sturgill et al. | |
| 5,946,850 A | 9/1999 | Sarkisyan | |
| 6,202,276 B1 * | 3/2001 | Chuang | 29/421.1 |
| D489,138 S | 4/2004 | Tyson et al. | |

OTHER PUBLICATIONS

HMMWV Shelters, General Dynamics, 2005.

* cited by examiner

*Primary Examiner*—Paul D Kim
(74) *Attorney, Agent, or Firm*—Barnes & Thornburg LLP

(57) ABSTRACT

An electromagnetic interference shielded panel and method of manufacture. The panel includes one or more frame members having a rib adapted to provide sacrificial material when a first skin member is welded to the frame member. The first skin member is welded to the frame members of a frame assembly prior to bonding of a core member and a second skin member to the first skin member and frame assembly.

7 Claims, 2 Drawing Sheets

METHOD OF MAKING AN ELECTROMAGNETIC INTERFERENCE SHIELDED PANEL

BACKGROUND

The present disclosure is directed to an electromagnetic interference shielded panel and method of construction.

Enclosures, such as shelters or containers, often contain equipment, such as electrical equipment, that may be adversely affected by electromagnetic waves. It is therefore desirable to construct the enclosure with panels that provide shielding against the passage of electromagnetic waves through the panel and into the enclosure to thereby shield the contents of the enclosure from electromagnetic interference.

SUMMARY

An electromagnetic interference shielded panel is disclosed for use in constructing an electromagnetic interference shielded enclosure. The panel includes a peripheral frame assembly having one or more frame members. Each frame member includes a first side wall extending between a first end and a second end, and a second side wall extending between a first end and a second end. An end wall is connected to the second end of each of the first side wall and second side wall. A base wall extends between the first ends of the first side wall and the second side wall. First and second inclined walls extend respectively between the first side wall and the end wall and the second side wall and the end wall.

The first side wall of the frame member includes a first surface extending from a first end to a second end, and a lip extending outwardly from the second end of the first surface to an outer end. The first surface and the lip form a first recess. The first side wall also includes a second surface extending from a first end to a second end with the first end of the second surface located at the outer end of the lip. A rib extends outwardly from the second end of the second surface. The first side wall also includes a third surface extending between a first end and a second end. The rib extends outwardly from the first end of the third surface. A second recess is formed between the second surface and the rib.

The panel also includes a first skin member having a peripheral edge. The edge of the first skin member is located in the second recess of the first side wall of the frame member and is adapted to be welded to the rib and thereby to the first side wall of the frame member. The weld between the edge of the first skin member and the first side wall of the frame members may be substantially continuously formed. A second skin member having a peripheral edge is coupled to the second side wall of the frame member and is spaced apart from the first skin member. A core member is located between the first and second skin members.

The electromagnetic interference shielded panel is formed by providing a frame assembly including one or more frame members. The first skin member is inserted into the second recess of the first side wall of the frame members, and the edge of the first skin member is located closely adjacent to the ribs of the frame members. The edge of the first skin member is then welded along the rib to the first side wall of each frame member. The core member is then placed adjacent to an interior surface of the first skin member. The second skin member is then placed adjacent the core member, and the edge of the second skin member is attached to the second side wall of the frame members.

BRIEF DESCRIPTION OF THE DRAWING FIGURES

DETAILED DESCRIPTION

Figure 1:
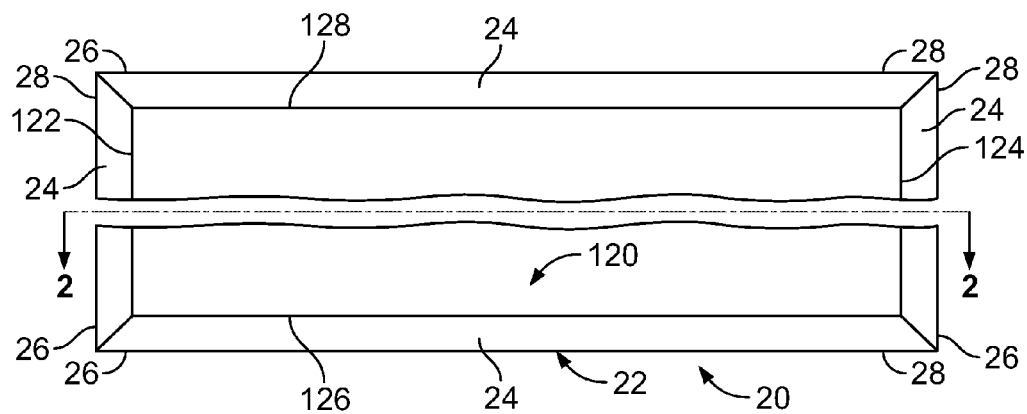
FIG. 1 is a partial side elevational view of the electromagnetic interference shielded panel of the present disclosure.
Figure 2:
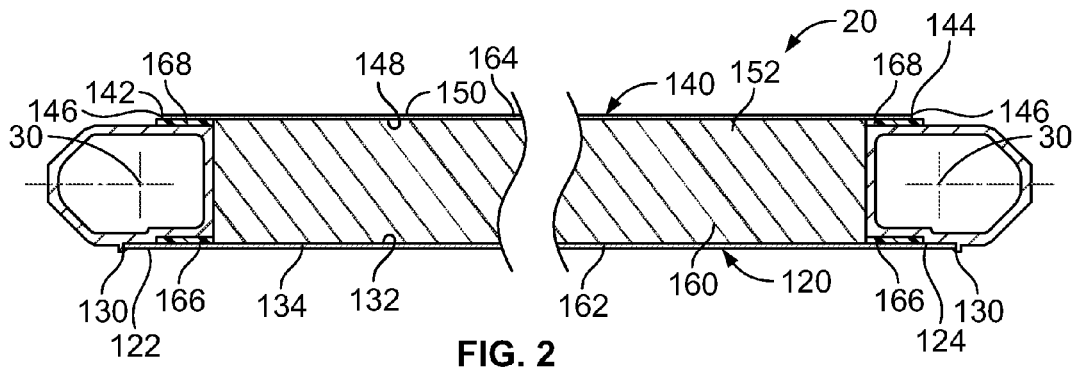
FIG. 2 is a cross sectional view of the panel taken along line 2-2 of FIG. 1.

The electromagnetic shielded panel 20 as shown in FIGS. 1 and 2 may be joined to a plurality of additional panels 20 by welding to form an enclosure, such as a shelter or container, having an interior chamber or space that is shielded from external sources of electromagnetic interference (EMI). The enclosure may be formed in various configurations as desired. The panel 20 as shown in FIGS. 1 and 2 is generally rectangular and generally planar. The panel 20 may be formed with various height and width dimensions as desired for constructing enclosures of different desired sizes. The panel 20 may be formed in various different configurations as desired, including, but not limited to polygonal-shaped, curvilinear-shaped, I-shaped, T-shaped, L-shaped and other configurations.

Figure 3:
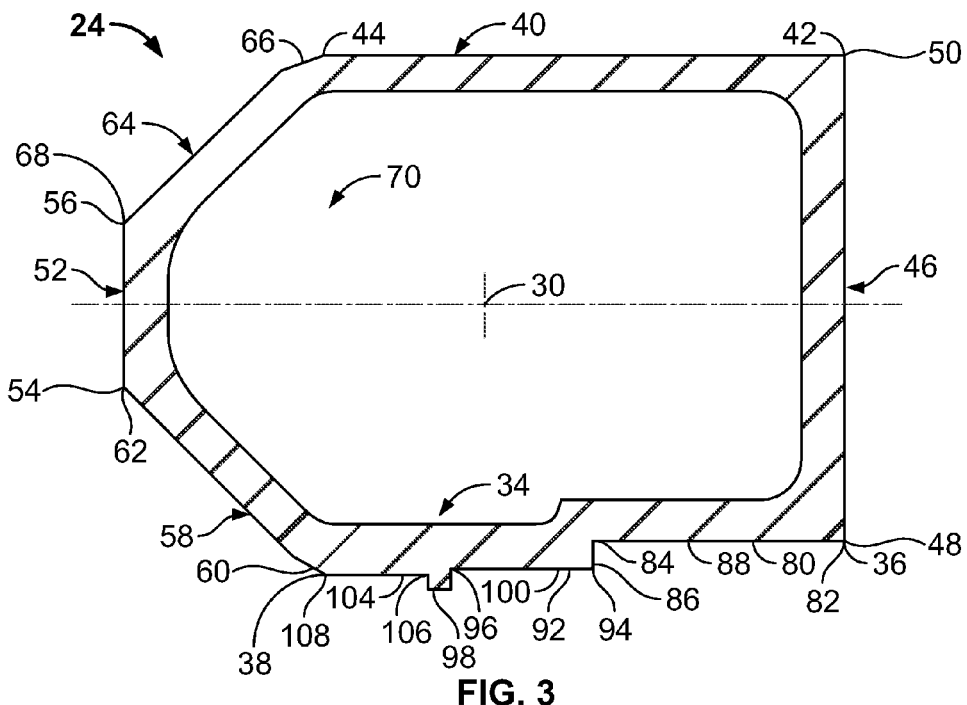
FIG. 3 is a cross sectional view of a frame member.

The panel 20 includes a peripheral frame assembly 22 including one or more frame members 24. The panel 20 as shown in FIG. 1 includes four frame members 24 attached end to end in a generally rectangular configuration. The frame members 24 may be attached to one another to form a frame assembly 22 in various different configurations as desired, including, but not limited to polygonal-shaped, curvilinear-shaped, I-shaped, T-shaped, L-shaped and other configurations. Each frame member 24 extends between a first end 26 and a second end 28 along a generally linear central axis 30. As shown in FIG. 3, each frame member 24 includes a first side wall 34 that extends between a first end 36 and a second end 38, and a generally planar second side wall 40 that extends between a first end 42 and a second end 44. The second side wall 40 is spaced apart from and generally parallel to the first side wall 44. The frame member 24 also includes a generally planar base wall 46 extending between a first end 48 and a second end 50. The first end 48 of the base wall 46 is attached to the first end 36 of the first side wall 34 and the second end 50 of the base wall 46 is attached to the first end 42 of the second side wall 40. The base wall 46 is located generally perpendicular to the first and second side walls 34 and 40. A generally planar end wall 52 extends between a first end 54 and second end 56 and is spaced apart from and generally parallel to the base wall 46. A generally planar first inclined wall 58 extends between a first end 60 and a second end 62. The first end 60 of the first inclined wall 58 is attached to the second end 38 of the first side wall 34. The second end 62 of the first inclined wall 58 is attached to the first end 54 of the end wall 52. The first inclined wall 58 is disposed at an angle of approximately 45° to the first side wall 34 and the end wall 52. The second inclined wall 64 includes a first end 66 and a second end 68. The first end 66 of the second inclined wall 64 is attached to the second end 44 of the second side wall 40. The second end 68 of the second inclined wall 64 is attached to the second end 56 of the end wall 52. The second inclined wall 64 is disposed at an angle of approximately 45° to the second side wall 40 and the end wall 52. The walls 34, 40, 46, 52, 58 and 64 form a hollow chamber 70 within the frame member 24. Each of the walls 34, 40, 46, 52, 58 and 64 extend from the first end 26 to the second end 28 of the frame member 24. The first inclined wall 58 and second inclined wall 64 may be disposed at other angles as desired. For example, the walls 58 and 64 may be inclined at an angle of approximately 22.5° with respect to the side walls to provide a chamfered effect at a corner of the enclosure, or at another angle to provide for a more aerodynamic shape or configuration of the enclosure. Enclosures of various configurations may thereby be formed with the panels 20.

The second side wall 40, base wall 46, end wall 52, and first and second inclined walls 58 and 64 each include a generally planar inner surface and a generally planar outer surface. The first side wall 34 includes a generally planar first surface 80 that extends between a first end 82 and a second end 84. The first end 82 of the first surface 80 is located at the first end 36 of the first side wall 34. A generally planar lip 86 extends outwardly from the second end 84 of the first surface 80, generally perpendicular to the first surface 80, to an outer end. The first surface 80 and the lip 86 form a first recess 88 in the first side wall 34.

The first side wall 34 of the frame member 24 also includes a generally planar second surface 92 extending between a first end 94 and a second end 96. The first end 94 of the second surface 92 is located adjacent the outer end of the lip 86. The second surface 92 is generally parallel to the first surface 80 and is spaced outwardly from the first surface 80 with respect to the central axis 30 of the frame member 24. An elongate generally linear sacrificial rib 98 is located at the second end 96 of the second surface 92 and extends outwardly from the second surface 92. The rib 98 and the second surface 92 form a second recess 100 in the first side wall 34 of the frame member 24. The rib 98 provides sacrificial material for use in joining a skin member to the frame member 24. The rib 98 may be generally rectangular in cross section, having a generally planar end surface and two generally planar side surfaces. The rib 98 may be approximately 0.05 inch high by approximately 0.05 inch wide. The rib 98 extends from the first end 26 to the second end 28 of the frame member 24.

The first side wall 34 of the frame member 24 also includes a generally planar third surface 104 extending between a first end 106 and a second end 108. The third surface 104 is generally parallel to the first surface 80 and the second surface 92. The third surface 104 is spaced outwardly from the second surface 92 and also forms the second recess 100 with the second surface 92. The second end 108 is located at the second end 38 of the first side wall 34. The first surface 80, second surface 92 and third surface 104 are each exterior surfaces of the first side wall 34, and each surface extends from the first end 26 to the second end 28 of the frame member 24.

The rib 98 is located on the first side wall 34 a distance greater than one-half of the distance between the first end 36 and second end 38 of the first side wall 34, and may be located approximately three-quarters of the distance between the first end 36 and second end 38 of the first side wall 34 from the first end 36, such that the rib 98 is located more closely to the second end 38 of the first side wall 34 than the first end 36. The rib 98 may be located in an alternate position on the exterior of the frame member 24 if desired.

The walls of the frame member 24 may be integrally attached to one another, and the frame member 24 may be formed as an extrusion. The walls of the frame member 24 may be approximately 0.06 inch thick. The frame member 24 may be formed from metal, such as aluminum, for example series 6000 aluminum. The frame member 24 may be formed from an electrically conductive material.

The panel 20 includes a generally planar first skin member 120, which may be located in the interior of the enclosure. The first skin member 120 extends between a left end 122 and a right end 124, and between a bottom end 126 and a top end 128. The first skin member 120 is generally rectangular as shown in FIG. 1 for use with a generally rectangular frame assembly 22, such that each end includes a generally linear edge 130. The first skin member 120 includes a plurality of generally linear edges 130 that form a peripheral edge. The first skin member 120 includes a peripheral edge configuration, and has an overall configuration, that corresponds to the configuration of the frame assembly 22. The first skin member 120 includes a generally planar inner surface 132 and a generally planar outer surface 134. Each edge 130 of the first skin member 120 is adapted to be respectively located within the second recess 100 of the first side wall 34 of a frame member 24, such that the inner surface 132 of the first skin member 120 is parallel to and in engagement with the second surface 92 of the first side wall 34. The edge 130 of the first skin member 120 is located closely adjacent to, and may be in abutment with, the rib 98 such that the edge 130 of the first skin member 120 may be continuously welded to the rib 98 and first side wall 34 with a weld 136. The thickness of the first skin member 120 may be approximately equal to the offset distance between the second surface 92 and third surface 104, such that the outer surface 134 of the first skin member 120 is generally coplanar with the third surface 104 of the frame member 24. The frame assembly 22 extends around the perimeter of the first skin member 120.

The first skin member 120 may be formed from a relatively thin plate or sheet of material having a thickness of approximately 0.025 inch. The first skin member 120 may be formed from metal, such as aluminum, for example 6061-T6 aluminum. The first skin member 120 may be formed from an electrically conductive material.

The panel 20 also includes a second skin member 140. The second skin member 140 is generally planar and extends between a left end 142 and a right end 144, and between a bottom end and a top end. The second skin member 140 is generally rectangular as shown in FIG. 1 for use with a generally rectangular frame assembly 22, such that each end includes a generally linear edge 146. The second skin member 140 includes a plurality of generally linear edges 146 that form a peripheral edge. The second skin member 140 includes a peripheral edge configuration, and has an overall configuration, that corresponds to the configuration of the frame assembly 22. The second skin member 140 also includes a generally planar inner surface 148 and a generally planar outer surface 150. The second skin member 140 may be formed from a relatively thin sheet or plate of material having a thickness of approximately 0.025 inch and, may be formed from a metal such as aluminum, for example 6061-T6 aluminum. The second skin member 140 may be electrically conductive. The second skin member 140 is spaced apart from and is generally parallel to the first skin member 120. Each end of the second skin member 140 is adapted to overlap with the second side wall 40 of a frame member 24 for attachment to the second side wall 40 by adhesive bonding. A chamber 152 is formed within the frame assembly 22 and between the first and second skin members 120 and 140.

A core member 160 having a generally planar first surface 162 and a generally parallel and generally planar second surface 164 is located within the chamber 152. The core member 160 extends between the first skin member 120 and second skin member 140 and between the frame members 24 of the frame assembly 22, substantially filling the chamber 152. The core member 160 may be adhesively bonded to the inner surface 132 of the first skin member 120 and to the inner surface 148 of the second skin member 140. The core member 160 may be formed from honeycomb core Nomex material.

The panel 20 may, if desired, include a first barrier member 166 located in the first recess 88 of the first side wall 34 of each frame member 24. The first barrier member 166 extends from the base wall 46 to the lip 86 adjacent to the first surface 80, and between the first surface 80 and the inner surface 132 of the first skin member 120. The barrier member 166 comprises a generally elongate rectangular strip that extends generally from the first end 26 to the second end 28 of each frame member 24. The panel 20 may also, if desired, include a second barrier member 168 located between the second side wall 40 of each frame member 24 and the ends of the second skin member 140. Each second barrier member 168 extends from the base wall 46 to a location adjacent the edge 146 of the second skin member 140, and along the length of the frame member 24 and edge 146 of the second skin member 140.

The first barrier member 166 may be attached by adhesive bonding to the first surface 80 of the first side wall 34 of the frame member 24 and to the inner surface 132 of the first skin member 120. The second barrier member 168 may be adhesively bonded to the second side wall 40 of the frame member 24 and to the interior surface 148 of the second skin member 140, such that the second skin member 140 is attached to the second side wall 40 through the second barrier member 168. Alternatively, if the panel 20 does not include a second barrier member 168, the inner surface 148 of the second skin member 140 may be attached by adhesive bonding directly to the second side wall 40 of the frame member 24. The first and second barrier members 166 and 168 comprise thermal barriers. The first and second barrier members 166 and 168 may be formed from a fiberglass epoxy laminate, such as G10/FR4, and may be a plastic sheet, laminated thermosetting, glass fiberbase, epoxy-resin, per MIL-I-24768/27. The first and second barrier members 166 and 168 are provided to improve the insulation characteristics of the panel 20, and may be eliminated from the panel 20 if desired.

The panel 20 is formed by attaching a plurality of frame members 24 to one another in an end-to-end relationship, such as by welding, to form the frame assembly 22. The frame assembly 22 may be formed with four frame members, namely, a bottom frame member, a top frame member, and two side frame members as shown in FIG. 1. The frame assembly 22 may alternatively be formed with fewer or additional frame members 24 in various configurations as desired. The first skin member 120 is then placed adjacent the frame members 24 of the frame assembly 22, such that each edge 130 of the skin member 120 is inserted into a respective second recess 100 of the first side wall 34 of a frame member 24 and adjacent the second surface 92 of the first side wall 34. Each edge 130 of the first skin member 120 is located adjacent to, and may abut, the rib 98 of the first side wall 34 of a respective frame member 24. Each edge 130 of the first skin member 120 is then welded, such as by arc welding, to the rib 98 and first side wall 34 of each frame member 24 along the length of the rib 98 and the edge 130 of the first skin member 120 with a substantially continuous weld 136. The rib 98 provides sacrificial material along the frame member 24 that provides melt characteristics similar to the thin first skin member material when the first skin member 120 is welded to the frame member 24 with welding methods that require an arc and that produce heat. The first skin member 120 is thereby integrally attached around its entire perimeter to the frame members 24 of the frame assembly 22 such that a continuous electromagnetic interference seal is formed between the first skin member 120 and the frame members 24 of the frame assembly 22. If desired an opening may be provided through the panel 20, extending through the skin members 120 and 140 and the core member 160, to provide access to the interior of an enclosure formed with the panel 20. The opening may be selectively sealed by a door formed with an EMI panel.

If the panel 20 is to include a first barrier member 166, a first barrier member 166 is then inserted in the first recess 88 of the first side wall 34 of each frame member 24 and is attached to the first surface 80 and first skin member 120 by adhesive bonding. The core member 160 is then placed within the frame assembly 22 between the frame members 24 and the first surface 162 of the core member 160 is attached by adhesive bonding to the inner surface 132 of the first skin member 120 and to the base walls 46 of the frame members 24. If desired, the second barrier members 168 may then be adhesively attached to the second side wall 40 of each frame member 24. The second skin member 140 may then be attached by adhesive bonding along each end of the second skin member 140 to a respective second barrier member 168 and thereby to the second surface 164 of the core member 160. If the panel 20 does not include a second barrier member 168, the edges of the second skin member 140 may be attached by adhesive bonding directly to the second side wall 40 of each frame member 24.

Prior methods of constructing an EMI panel involved welding of the skin members to the frame member after the skin members were adhesively bonded to the core member. The heat generated during the welding process caused damage to the bonding. Skip welding was previously used to join the skin member to the frame member and cooling time would have to be provided to minimize the amount of heat generated in order to avoid damaging the bonding, substantially slowing the production process.

The present method of manufacture forms an EMI seal between the first skin member 120 and the frame members 24 of the frame assembly 22 with a substantially continuous weld prior to assembly and bonding of the core member 116 and second skin member 140 to the first skin member 120 and frame assembly 22. This process provides a robust and continuous EMI seal around the perimeter of the panel 20 between the first skin member 120 and the frame assembly 22. This process also provides a durable, highly conductive metal-to-metal joint to maximize EMI shielding capability. No secondary sealing processes are required. The use of the sacrificial rib 98 in the welding process avoids distorting the first skin member 120 during welding thereby eliminating any defects that could be detrimental to the bonding process. The rib 98 allows heat up rates during welding to be closer for the skin member 120 and the frame member 24 than would otherwise occur without the rib 98. The rib 98 may vary in shape and size to facilitate welding, depending on variables such as the thickness of the skin member and material properties. Steel bars may be used on the skin members for clamping and as a heat sink during welding. Because the bonding of the core member 160 and second skin member 140 is performed after the welding process, the bonding cannot be damaged by the heat of welding. The panels 20 may be easily visually inspected to verify the integrity of the weld and EMI seal, and any EMI leaks in the panel can be easily repaired with basic welding techniques, prior to bonding of the core member 160 and second skin member 140 to the first skin member 120 and frame assembly 22.

Figure 4:
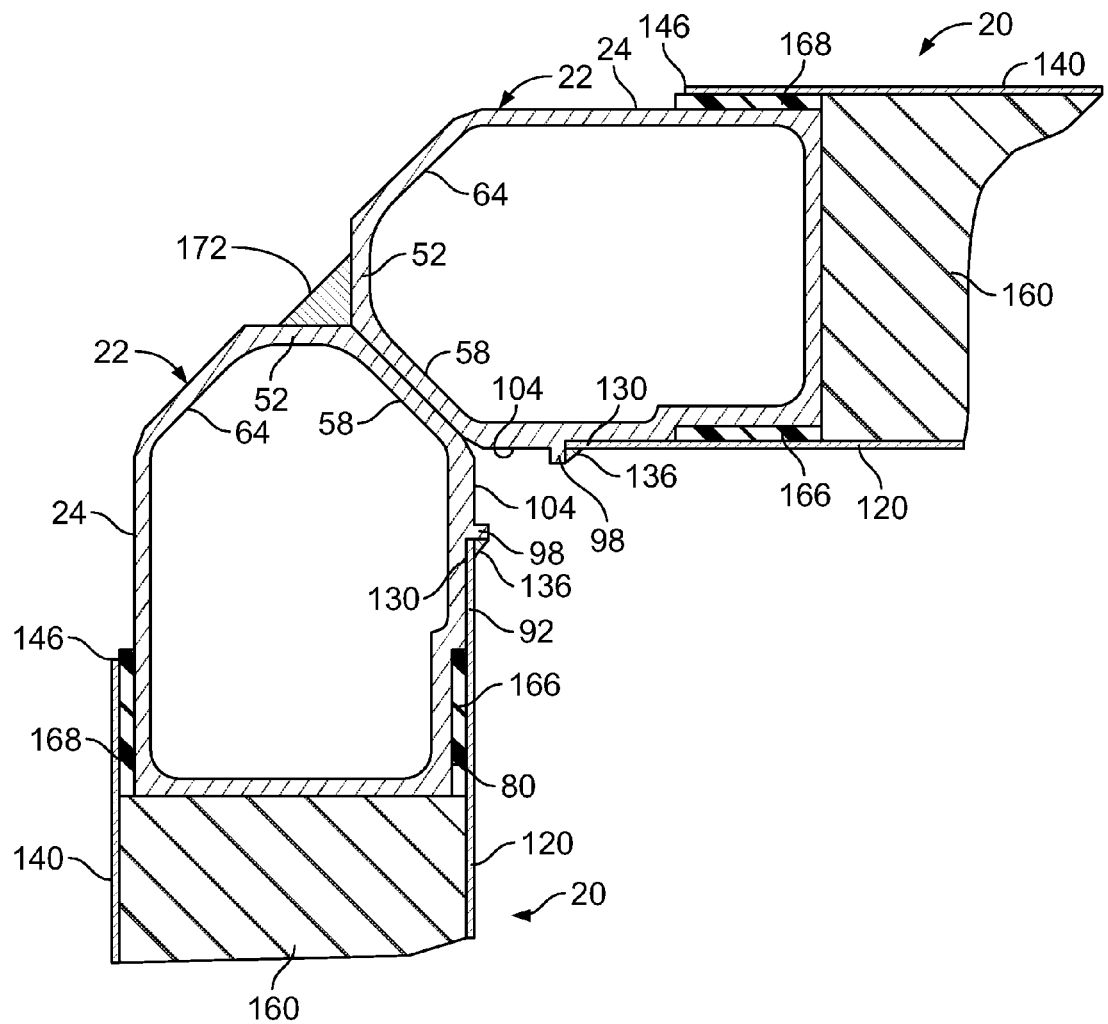
FIG. 4 is a partial cross sectional view showing the ends of two panels joined to one another with the panels at a right angle.

As shown in FIG. 4, two panels 20 can be attached to one another at a right angle relative to one another. In order to form a corner joint as shown in FIG. 4, two panels are placed at right angles with respect to one another with the first inclined wall 58 of a frame member 24 of a first panel 20 in abutting engagement with the first inclined wall 58 of the frame member 24 of a second panel 20. The end wall 52 of the first panel 20 is attached to the end wall 52 of the second panel 20 by a weld 172 that extends substantially continuously along the length of the frame members 24. If desired the third surfaces 104 of the first and second panels 20 may be welded to one another to provide additional strength and rigidity.

Figure 5:
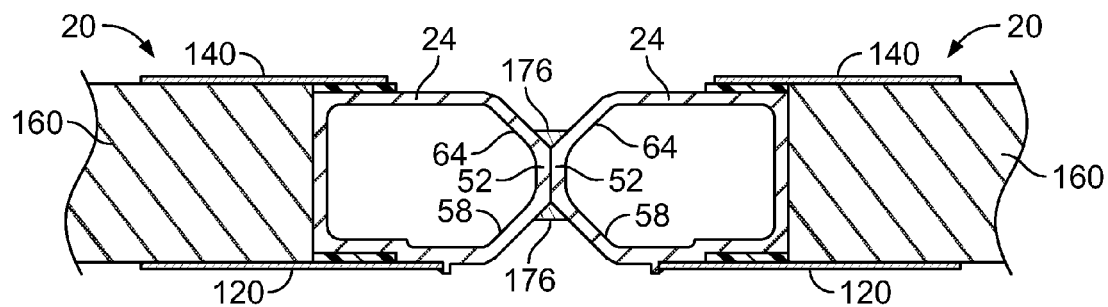
FIG. 5 shows the ends of two panels joined to one another with the panels in alignment with one another.

As shown in FIG. 5, two panels 20 may be attached end-to-end in generally co-planar alignment with one another. The end wall 52 of the frame member 24 of a first panel 20 is abutted against the end wall 52 of the frame member 24 of a second panel 20. The inclined side walls of the respective frame members 24 may be attached to one another by a weld 176 on one or both sides of the end walls 52.

Various features of the invention have been particularly shown and described in connection with the illustrated embodiment of the invention, however, it must be understood that these particular arrangements merely illustrate, and that the invention is to be given its fullest interpretation within the terms of the appended claims.

What is claimed is:

1. A method of making an electromagnetic interference shielded panel, the method comprising the steps of:
   providing a frame member including a first side wall having an outwardly extending rib and a second side wall;
   placing a first skin member adjacent said first side wall of said frame member;
   locating an edge of said first skin member adjacent said rib of said first side wall of said frame member;
   welding said edge of said first skin member along said rib to said first side wall of said frame member;
   placing a core member adjacent an interior surface of said first skin member;
   placing a second skin member adjacent said second side wall of said frame member; and
   attaching an end of said second skin member to said second side wall of said frame member.

2. The method of claim 1 wherein said edge of said first skin member and said first side wall of said frame member are substantially continuously welded to one another.

3. The method of claim 1 including inserting a barrier member into a first recess of said first side wall of said frame member prior to placing said core member adjacent said first skin member.

4. The method of claim 1 including bonding said end of said second skin member to said second side wall of said frame member.

5. The method of claim 1 including bonding a barrier member to said second side wall of said frame member and bonding said end of said second skin member to said barrier member such that said end of said second skin is attached to said second side wall of said frame member.

6. A method of making an electromagnetic interference shielded panel, the method comprising the steps of:
   providing a frame member including a first side wall having an outwardly extending rib and a second side wall;
   placing a first skin member adjacent said first side wall of said frame member;
   locating an edge of said first skin member adjacent said rib of said first side wall of said frame member;
   welding said edge of said first skin member along said rib to said first side wall of said frame member;
   bonding a core member to an interior surface of said first skin member after said first skin member is welded to said frame member;
   placing a second skin member adjacent said second side wall of said frame member;
   bonding an end of said second skin member to said second side wall of said frame member; and
   bonding said second skin member to said core member after said first skin member is welded to said frame member.

7. A method of making an electromagnetic interference shielded panel, the method comprising the steps of:
   providing a frame member including a first side wall having a generally planar surface and an elongate rib extending outwardly from said generally planar surface and a second side wall;
   placing a first skin member adjacent said generally planar surface of said first side wall of said frame member;
   locating an edge of said first skin member adjacent said rib of said first side wall of said frame member;
   welding said edge of said first skin member along said rib to said first side wall of said frame member;
   placing a core member adjacent an interior surface of said first skin member;
   placing a second skin member adjacent said second side wall of said frame member; and
   attaching an end of said second skin member to said second side wall of said frame member.

* * * * *